US011669757B2

(12) United States Patent
Botea et al.

(10) Patent No.: US 11,669,757 B2
(45) Date of Patent: Jun. 6, 2023

(54) OPERATIONAL ENERGY CONSUMPTION ANOMALIES IN INTELLIGENT ENERGY CONSUMPTION SYSTEMS

(71) Applicant: INTERNATIONAL BUSINESS MACHINES CORPORATION, Armonk, NY (US)

(72) Inventors: Adi Botea, Dublin (IE); Beat Buesser, Dublin (IE); Akihiro Kishimoto, Dublin (IE); Bei Chen, Blanchardstown (IE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 1164 days.

(21) Appl. No.: 16/262,464

(22) Filed: Jan. 30, 2019

(65) Prior Publication Data
US 2020/0242493 A1    Jul. 30, 2020

(51) Int. Cl.
*G06N 5/04* (2006.01)
*G06N 5/048* (2023.01)
*G01R 21/133* (2006.01)
*G06N 20/00* (2019.01)
*G06F 30/20* (2020.01)
*G01R 19/25* (2006.01)

(52) U.S. Cl.
CPC ......... *G06N 5/048* (2013.01); *G01R 19/2513* (2013.01); *G01R 21/133* (2013.01); *G06F 30/20* (2020.01); *G06N 20/00* (2019.01)

(58) Field of Classification Search
CPC ........ G06N 5/048; G06N 20/00; G06N 5/003; G01R 19/2513; G01R 21/133; G01R 22/10; G06F 30/20
USPC ............................................... 702/12, 14, 45
See application file for complete search history.

(56) References Cited

U.S. PATENT DOCUMENTS

| | | | |
|---|---|---|---|
| 11,158,007 B2 * | 10/2021 | Fox | H04L 67/12 |
| 2014/0245071 A1 | 8/2014 | Drees et al. | |
| 2015/0006127 A1 * | 1/2015 | An | G06Q 10/04 703/2 |
| 2015/0178865 A1 | 6/2015 | Anderson et al. | |
| 2016/0187911 A1 | 6/2016 | Carty et al. | |
| 2016/0203036 A1 | 7/2016 | Mezic et al. | |
| 2017/0296056 A1 * | 10/2017 | Hresko | A61B 5/0015 |
| 2019/0347577 A1 * | 11/2019 | Ba | G06N 20/00 |
| 2020/0001048 A1 * | 1/2020 | Oren | A61B 17/00 |
| 2020/0338351 A1 * | 10/2020 | Panken | A61B 5/7221 |

* cited by examiner

Primary Examiner — Giovanni Astacio-Oquendo
(74) Attorney, Agent, or Firm — Griffiths & Seaton PLLC

(57) ABSTRACT

Embodiments for detection of energy consumption anomalies in one or more energy consumption systems in a cloud computing environment by a processor. Energy consumption anomalies associated with a selected facility, a selected object, or a combination thereof may be detected and diagnosed according to feedback and simulation data generated from a scenario-based simulation operation.

20 Claims, 9 Drawing Sheets

OPERATIONAL ENERGY CONSUMPTION ANOMALIES IN INTELLIGENT ENERGY CONSUMPTION SYSTEMS

BACKGROUND OF THE INVENTION

Field of the Invention

The present invention relates in general to computing systems, and more particularly to, various embodiments for intelligent detection and diagnosis of energy consumption anomalies in one or more intelligent energy consumption systems using a computing processor.

Description of the Related Art

In today's society, various advances in mechanical systems, coupled with advances in computing technology have made possible a wide variety of attendant benefits, such as increasing the efficiency of fluid transfer pumping systems. As computers proliferate throughout aspects of society, additional opportunities continue to present themselves for leveraging technology in energy management systems for improving efficiency of power and energy consumption.

SUMMARY OF THE INVENTION

Various embodiments for intelligent detection of energy consumption anomalies in one or more buildings (e.g., energy consumption systems in a building) and refrigeration systems that may be associated with a cloud computing environment by a processor are provided. In one embodiment, by way of example only, a method/system for intelligent detection and diagnosis of energy consumption anomalies in one or more energy consumption systems using an array of Internet of Things (IoT) sensors in a computing environment is provided. Energy consumption anomalies associated with a selected facility, a selected object, or a combination thereof may be detected and diagnosed according to feedback and simulation data generated from a scenario-based simulation operation.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
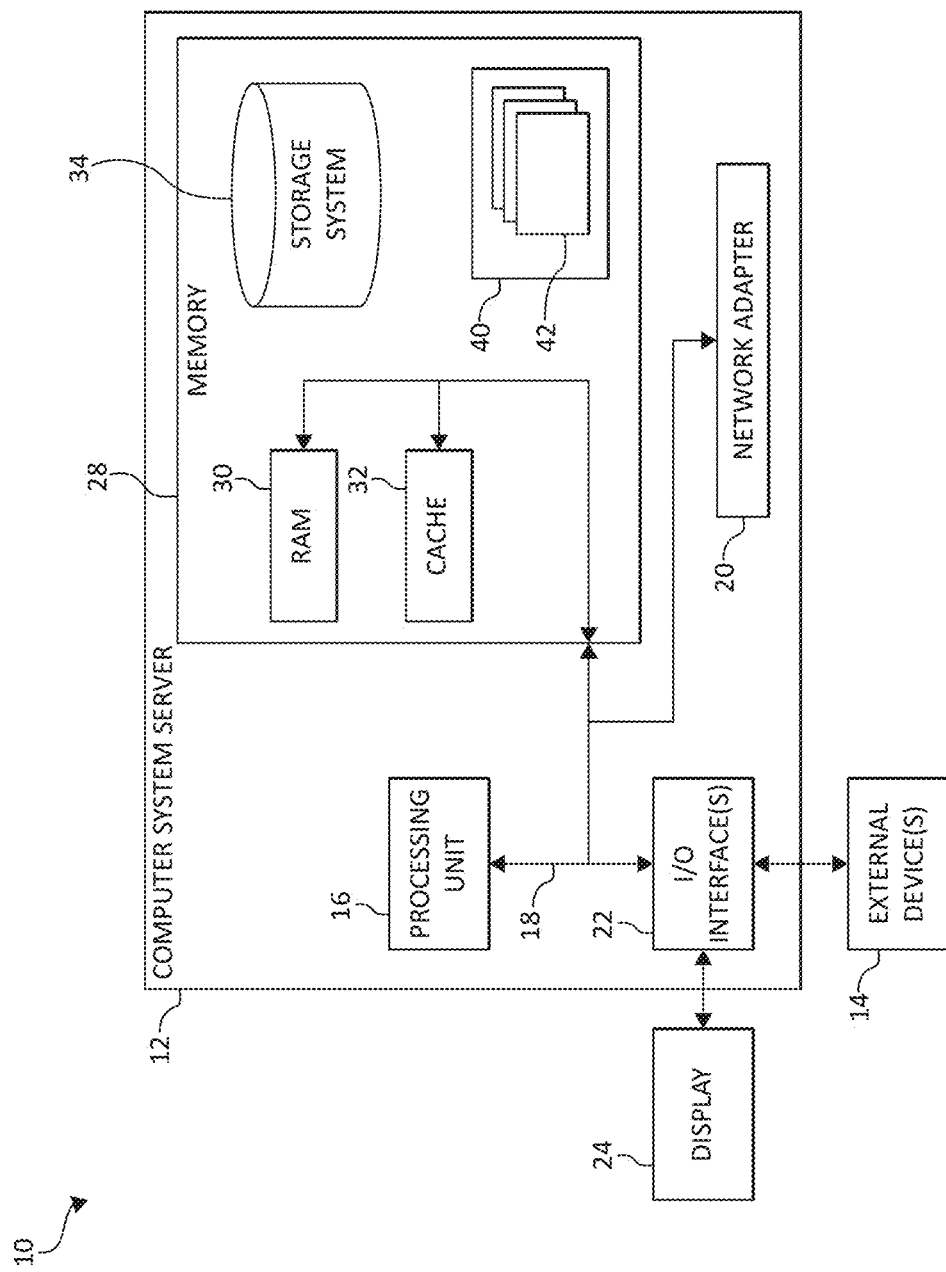
FIG. 1 is a block diagram depicting an exemplary computing node according to an embodiment of the present invention.

Energy consumption, monitoring, and management are crucial components of infrastructures such as, for example, buildings and/or refrigeration system. In modern society, buildings and/or refrigeration systems provide very important space for various activities such as, for example, business, educational, governmental, organizational, and even activities of daily living (e.g., an apartment complex). For example, most business activities happen in the buildings, such as business strategy planning, business negotiation, customer visit, software development, hardware design, etc. Providing a comfortable and inviting environment for occupants of the building is instrumental to improve their working or living efficiency and productivity, which however, necessarily requires provision of better illumination, air conditioning and ventilation. As a result, more energy is consumed.

For example, given that commercial and office buildings consume a significant amount of energy consumption in industrialized countries, a significant amount of this energy may saved if building operation anomalies are detected on time. Operational anomalies occur due to equipment failures and human management errors. Attempts have been made for detecting building anomalies, but most of these operations apply unsupervised machine learning methods, which relies on comparing current consumption with historical values. Such approaches have two fundamental challenges: 1) machine learning models are typically trained on the contaminated data and 2) the inability to distinguish between data anomalies and operational anomalies. In one aspect, a data anomaly may include any sensor data issue (e.g., mis-recording, missing recording, and the like) and operational anomaly means any abnormal consumption behavior. Consequently, many false alarms are triggered particularly when data are noisy (at low aggregation level). Also, the volume and speed at which sensor data are generated makes it infeasible to have them labelled.

Thus, the present invention provides a cognitive system for intelligent detection and diagnosis of energy consumption anomalies in one or more energy consumption systems using an array of Internet of Things (IoT) sensors in a computing environment. Energy consumption anomalies associated with a selected facility, a selected object, or a combination thereof may be detected and diagnosed according to feedback (e.g., user feedback, etc.) and simulation data generated from a scenario-based simulation operation.

In an additional aspect, the present invention provides a cognitive system for real-time anomaly detection and diagnostics in sensor-equipped buildings and refrigeration systems using sensor/meter data generated from scenario-based simulation. One or more machine learning models may be trained using uncontaminated data (e.g., data with labels) and distinguishes between data anomaly and operational anomaly using active learning. In one aspect, active learning is machine learning that is able to interactively query the user (or some other information source such as, for example, a sensor/IoT device) to obtain desired outputs at new data points.

It should be noted that active learning is a form a machine learning. In machine learning, the learning may be supervised, unsupervised and/or semi-supervised. In supervised machine learning, a computer provides inputs consisting of manually-labeled training data, and their desired outputs, with the goal of generating general rules and features that can subsequently be used to associate a given input with a corresponding output. However, manually labeling unlabeled data for supervised machine learning can be time consuming, tedious, and expensive.

In contrast, unsupervised learning approaches do not use training data to learn explicit features but infers functions to discover non-obvious or hidden structures within unlabeled data. Alternatively, semi-supervised approaches to machine learning typically use a small amount of labeled data in combination with a large amount of unlabeled data for training. Active learning, a form of semi-supervised machine learning, provides a learning algorithm that interactively queries a user, or other information source, to obtain labels for a subset of unannotated input data. The object in active learning is to identify patterns based on a limited amount of data. Active learning may be used in machine learning tasks, such as classification, when the work of automatically labeling data is too costly. In such active learning approaches, the learner typically chooses the examples to be labeled. As a result, the number of examples needed to learn a concept may be lower than the number of examples needed for typical supervised learning approaches. In short, active learning is may be an operation in which a user (or other source) may manually label a subset of the training data samples. Active learning may include selecting which samples are to be labeled so that the total number of samples that may need to be labeled in order to adequately train the machine is decreased. The reduced labeling effort can therefore save significant time and expense as compared to labeling all of the possible training samples.

In an additional aspect, cognitive or "cognition" may refer to a mental action or process of acquiring knowledge and understanding through thought, experience, and one or more senses using machine learning (which may include using sensor-based devices or other computing systems that include audio or video devices). Cognitive may also refer to identifying patterns of behavior, leading to a "learning" of one or more events, operations, or processes. Thus, the cognitive model may, over time, develop semantic labels to apply to observed behavior and use a knowledge domain or ontology to store the learned observed behavior. In one embodiment, the system provides for progressive levels of complexity in what may be learned from the one or more events, operations, or processes.

In an additional aspect, the term cognitive may refer to a cognitive system. The cognitive system may be a specialized computer system, or set of computer systems, configured with hardware and/or software logic (in combination with hardware logic upon which the software executes) to emulate human cognitive functions. These cognitive systems apply human-like characteristics to convey and manipulate ideas which, when combined with the inherent strengths of digital computing, can solve problems with a high degree of accuracy (e.g., within a defined percentage range or above an accuracy threshold) and resilience on a large scale. A cognitive system may perform one or more computer-implemented cognitive operations that approximate a human thought process while enabling a user or a computing system to interact in a more natural manner. A cognitive system may comprise artificial intelligence logic, such as natural language processing (NLP) based logic, for example, and machine learning logic, which may be provided as specialized hardware, software executed on hardware, or any combination of specialized hardware and software executed on hardware. The logic of the cognitive system may implement the cognitive operation(s), examples of which include, but are not limited to, question answering, identification of related concepts within different portions of content in a corpus, and intelligent search algorithms, such as Internet web page searches.

In general, such cognitive systems are able to perform the following functions: 1) Navigate the complexities of human language and understanding; 2) Ingest and process vast amounts of structured and unstructured data; 3) Generate and evaluate hypotheses; 4) Weigh and evaluate responses that are based only on relevant evidence; 5) Provide situation-specific advice, insights, estimations, determinations, evaluations, calculations, and guidance; 6) Improve knowledge and learn with each iteration and interaction through machine learning processes; 7) Enable decision making at the point of impact (contextual guidance); 8) Scale in proportion to a task, process, or operation; 9) Extend and magnify human expertise and cognition; 10) Identify resonating, human-like attributes and traits from natural language; 11) Deduce various language specific or agnostic attributes from natural language; 12) Memorize and recall relevant data points (images, text, voice) (e.g., a high degree of relevant recollection from data points (images, text, voice) (memorization and recall)); and/or 13) Predict and sense with situational awareness operations that mimic human cognition based on experiences.

Additional aspects of the present invention and attendant benefits will be further described, following.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, tablets, and the like).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

In the context of the present invention, and as one of skill in the art will appreciate, various components depicted in FIG. 1 may be located in a moving vehicle. For example, some of the processing and data storage capabilities associated with mechanisms of the illustrated embodiments may take place locally via local processing components, while the same components are connected via a network to remotely located, distributed computing data processing and storage components to accomplish various purposes of the present invention. Again, as will be appreciated by one of ordinary skill in the art, the present illustration is intended to convey only a subset of what may be an entire connected network of distributed computing components that accomplish various inventive aspects collectively.

Figure 2:
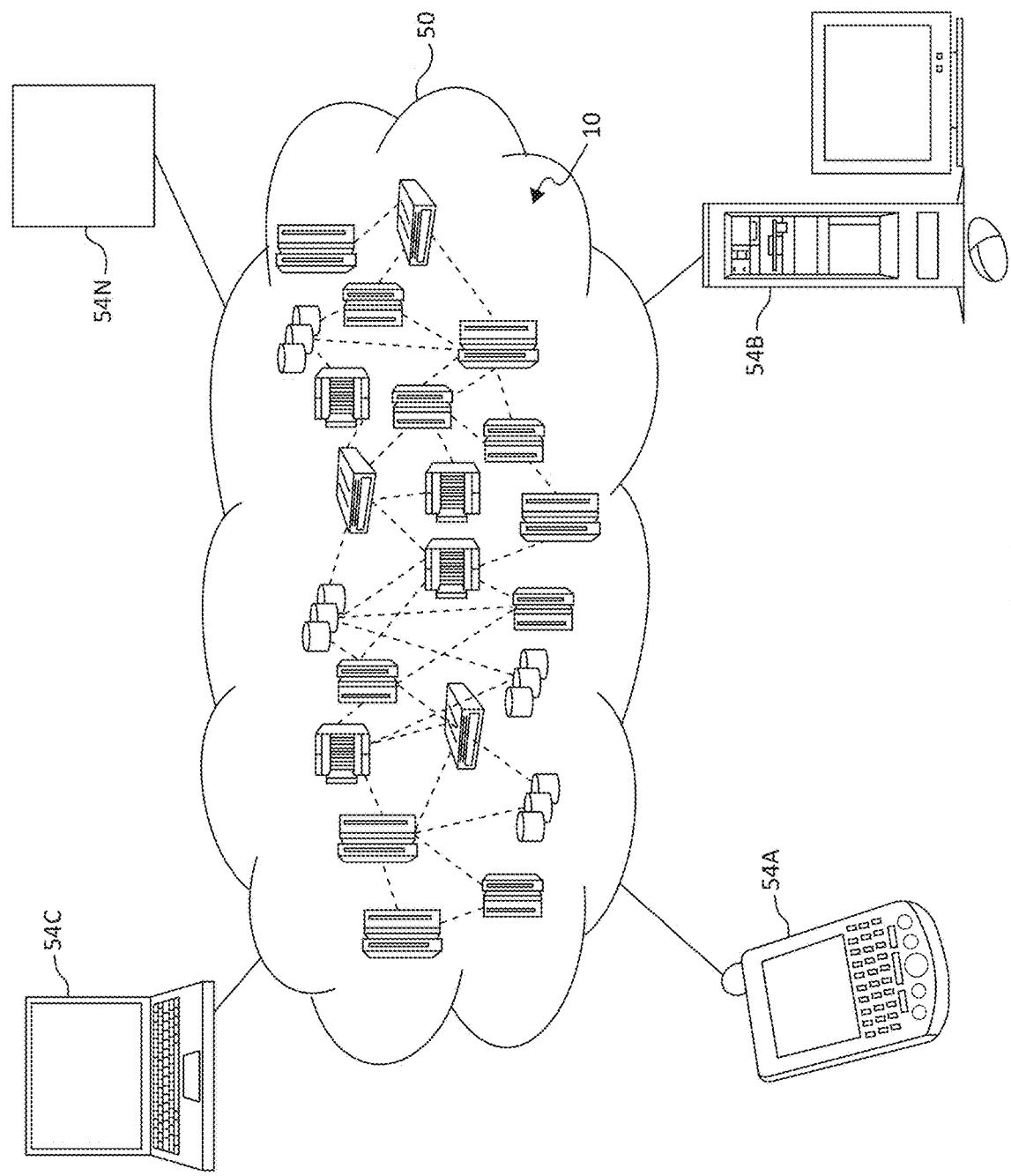
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
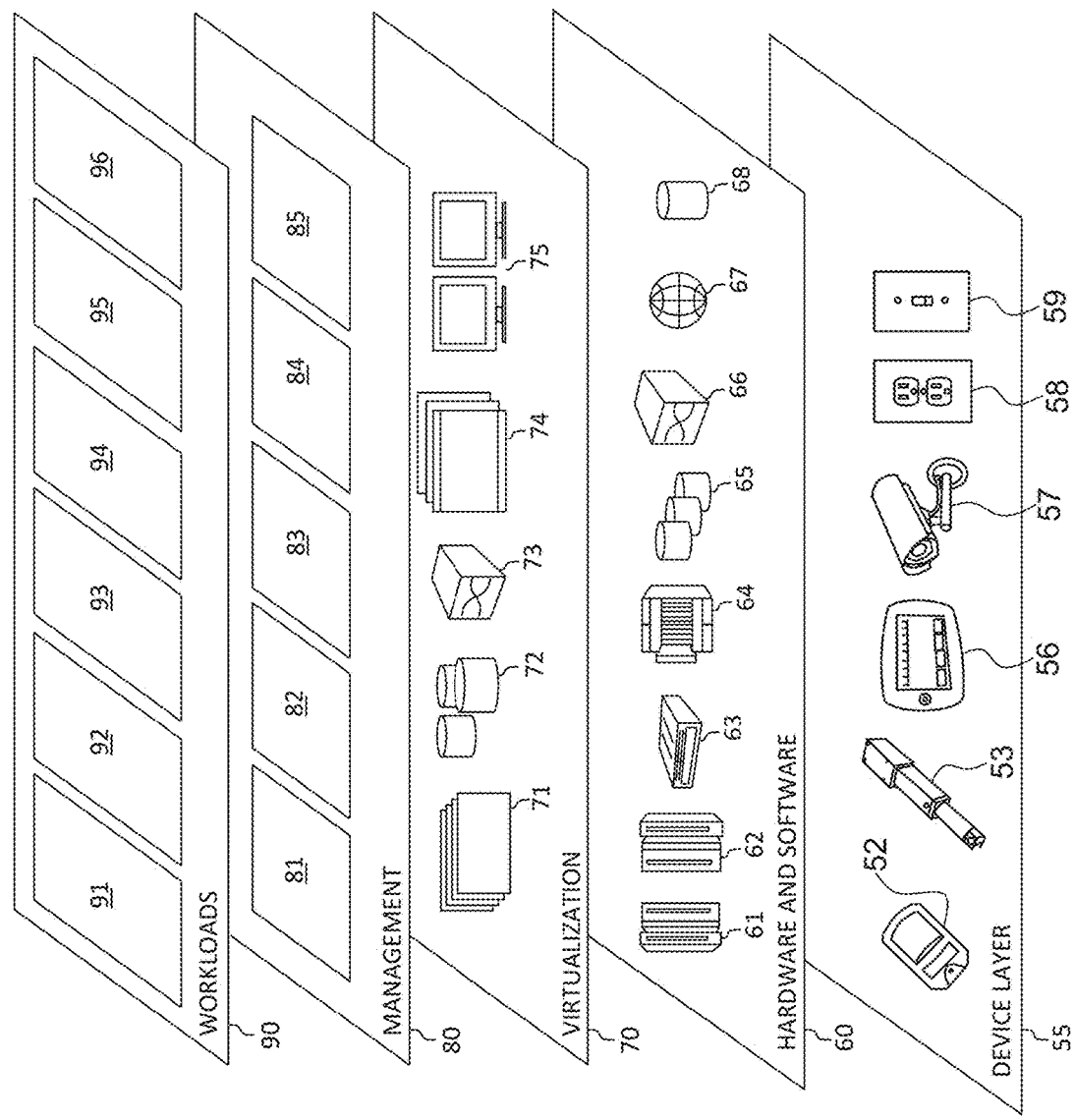
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for intelligent detection and diagnosis of energy consumption. In addition, workloads and functions 96 for intelligent detection and diagnosis of energy consumption may include such operations as data analysis (including data collection and processing from various environmental sensors), and predictive data analytics functions. One of ordinary skill in the art will appreciate that the workloads and functions 96 for cognitive detection of energy consumption may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

Figure 4:
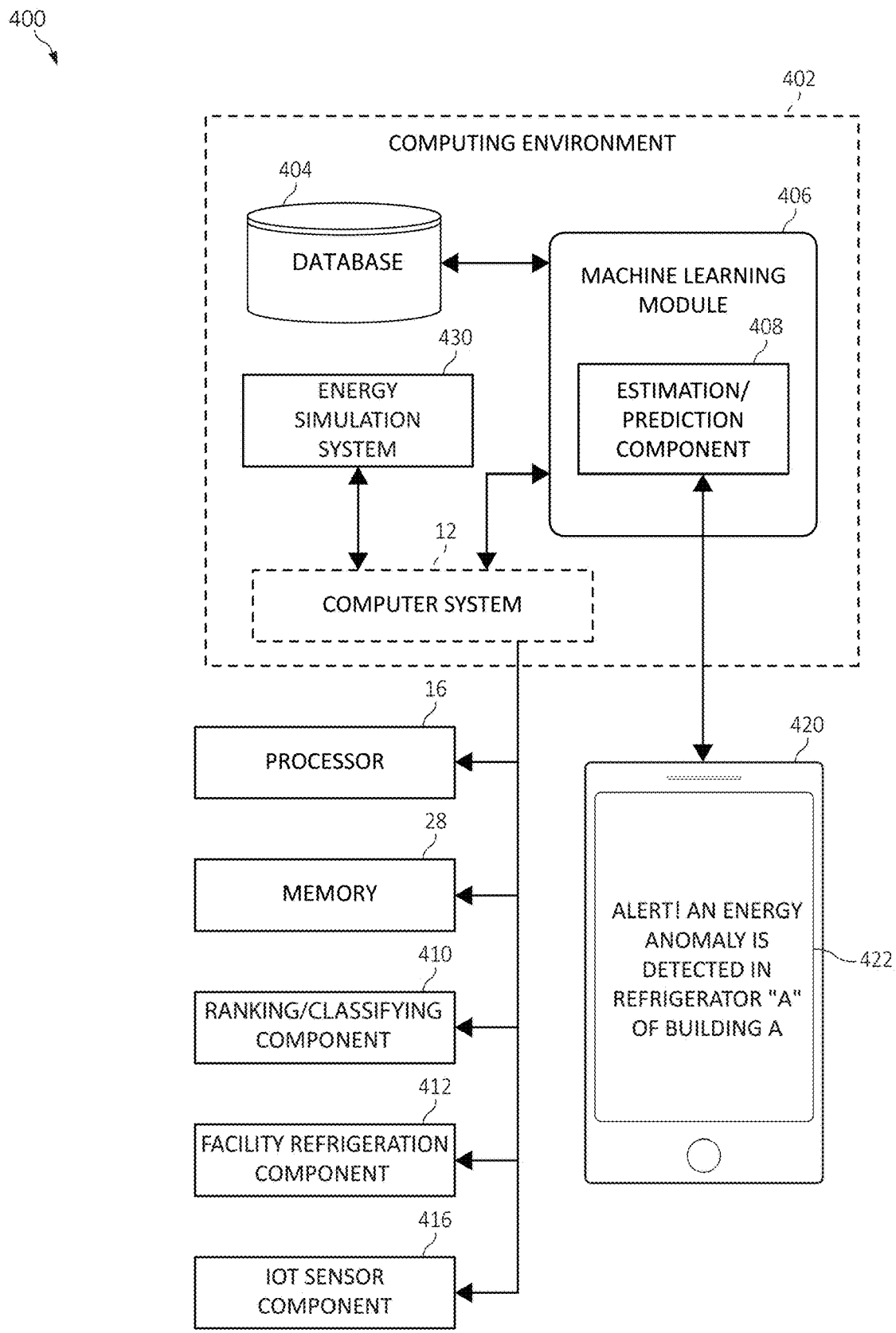
FIG. 4 is a diagram depicting various user hardware and computing components functioning in accordance with aspects of the present invention.

Turning now to FIG. 4, a block diagram depicting exemplary functional components 400 according to various mechanisms of the illustrated embodiments is shown. FIG. 4 illustrates intelligent detection and diagnosis of energy consumption anomalies in one or more energy consumption systems using an array of Internet of Things (IoT) sensors in an IoT computing environment, such as a computing environment 402, according to an example of the present technology. As will be seen, many of the functional blocks may also be considered "modules" or "components" of functionality, in the same descriptive sense as has been previously described in FIGS. 1-3. With the foregoing in mind, the module/component blocks 400 may also be incorporated into various hardware and software components of a system for accurate temporal event predictive modeling in accordance with the present invention. Many of the functional blocks 400 may execute as background processes on various components, either in distributed computing components, or on the user device, or elsewhere. Computer system/server 12 is again shown, which may incorporate processing unit 16 and memory 28 to perform various computational, data processing and other functionality in accordance with various aspects of the present invention.

The system 400 may include the computing environment 402 (e.g., included in a heat exchange system/unit), an energy simulation system 430, and a device 420, such as a desktop computer, laptop computer, tablet, smartphone, and/or another electronic device that may have one or more processors and memory. The device 420, the energy simulation system 430, and the computing environment 402 may each be associated with and/or in communication with each other, by one or more communication methods, such as a computing network. In one example, the device 420 and/or the energy simulation system 430 may be controlled by an owner, customer, or technician/administrator associated with the computing environment 402. In another example, the device 420 and/or the energy simulation system 430 may be completely independent from the owner, customer, or technician/administrator of the computing environment 402.

In one aspect, the computing environment 402 may provide virtualized computing services (i.e., virtualized computing, virtualized storage, virtualized networking, etc.) to devices 420. More specifically, the computing environment 402 may provide virtualized computing, virtualized storage, virtualized networking and other virtualized services that are executing on a hardware substrate.

As depicted in FIG. 4, the computing environment 402 may include a machine learning module 406, database 404 (e.g., a knowledge domain and/or database of historical data) that is associated with a machine learning module 406, and the energy simulation system 430. The database 404 may also include energy usage profiles, building profiles (e.g., building characteristics or parameters) for each energy simulation system 430 (that may be included in one or more buildings) and/or IoT sensor devices (e.g., "smart readers") associated with an IoT sensor component 416. It should be noted that one or more IoT sensor devices may be represented as the IoT sensor component 416 may be coupled to the energy simulation system 430. In one aspect, the IoT sensor component 416 may be a smart meter that may record consumption of electric energy. The smart meter may record the consumption of electric energy in selected time intervals and communicate that information at various selected periods of time. In an additional aspect, the IoT sensor component 416 may be associated with one or more smart meters for collecting, recording, and measuring energy consumption in one or more buildings and/or refrigeration systems.

The database 404 may be a combination of both current sensor/meter data and/or historical sensor/meter data. In an additional aspect, the database 404 may include labels, features, tuning parameters, building characteristics, energy consumption data, temperature data, historical data, tested and validated data, or other specified/defined data for testing, monitoring, validating, detecting, learning, analyzing and/or calculating various conditions or diagnostics relating to cognitively detecting energy consumption anomalies in the energy simulation system 430. That is, different combinations of parameters and labels may be selected and applied to the input data for learning or training one or more machine learning models of the machine learning module 406. The database 404 may define one or more settings of the IoT sensors (e.g., smart meters) associated with the IoT sensor component 416 to enable the collecting, recording, and measuring energy consumption in one or more buildings. The one or more the IoT sensors (e.g., smart meters) associated with the IoT sensor component 416 may be coupled to the energy simulation system 430 at one or more defined distances from alternative IoT sensors (e.g., smart meters).

The computing environment 402 may also include a computer system 12, as depicted in FIG. 1. The computer system 12 may also include the energy simulation system 430, a facility/refrigeration component 412, and an IoT sensor component 416 each associated with the machine learning module for training and learning one or more machine learning models and also for applying multiple combinations of labels, features, tuning parameters, building characteristics, energy consumption profiles for each building, normalized/standardized energy consumption values, previously estimated energy consumption values, temperature data, or a combination thereof to the machine learning model for cognitive detection of energy consumption anomalies in one or more buildings.

In one aspect, the facility/refrigeration component 412 includes data relating to the characteristics, parameters, features, and/or energy consumption information relating to each building/facility and/or refrigeration systems in association with the energy simulation system 430.

In one aspect, the machine learning module 406 may include an estimation/prediction component 408 for cognitively predicting and/or simulating energy consumption for one or more building/facility and/or refrigeration systems according to one or more energy consumption measurements. The machine learning module 406 may collect feedback information from the one or more IoT sensors/smart meters associated with the IoT sensor component 416 to cognitively learn, actively learn, and/or simulate one or more energy consumption simulation models for predicting the energy consumption, and/or dynamically change one or more tuning parameters of one or more prediction models for predicting the energy consumption (in association with the energy simulation system 430). The machine learning module 406 may use the feedback information to provide cognitive detection and diagnosis of energy consumption (e.g., detecting energy consumption anomalies) according to an energy anomaly simulation scenario using the estimation/prediction component 408. The machine learning module 406 may be initialized using feedback information to learn behavior of the energy simulation system 430 for each particular building/facility and/or refrigeration systems.

The energy simulation system 430 may detect one or more anomalies of energy consumption associated with a selected facility, a selected object, or a combination thereof according to feedback and simulation data generated from a scenario-based simulation operation.

The IoT sensor component 416 may collect sensor data from one or more IoT devices, sensor devices, or a combination thereof associated with the selected facility, the selected object, or a combination thereof. The energy simulation system 430 may train one or more machine learning models using uncontaminated data.

The energy simulation system 430, in association with the machine learning module 406, may apply one or more machine learning models, a classifier, a decision tree, a natural language processing ("NLP") operation, or a combination thereof to one or more defined anomaly scenarios during the scenario-based simulation operation. The energy simulation system 430 may distinguish between a data anomaly and an operational anomaly associated with the selected facility, the selected object, or a combination thereof using an active learning operation.

The ranking/classifying component 410 may rank the one or more anomalies of energy consumption according to a priority score, an assigned confidence level, a predicted energy efficiency cost saving, or a combination thereof. The ranking/classifying component 410 may generate a list of anomalies according to an assigned rank.

The energy simulation system 430, in association with the IoT sensor component 416, may enable one or more reading systems (IoT sensors or smart meters) for capturing power consumption data in the one or more buildings so as to identify exact location for energy/power consumption anomalies.

The energy simulation system 430 may alert a user (e.g., via device 420) of the detected and/or diagnosed energy/power consumption anomalies using energy consumption labeled data. The device 420 may include a graphical user interface (GUI) 422 enabled to display on the device 420 one or more user interface controls for a user to interact with the GUI 422. For example, the GUI 422 may display the detected energy/power consumption anomalies to a user via an interactive graphical user interface (GUI) according to the cognitive detection of energy consumption anomalies in the energy management system. For example, the output to the device may be an alert that indicates or displays audibly and/or visually on the GUI 422 "ALERT! An energy anomaly is detected in refrigerator "A" of building A."

In one aspect, the cognitive detection of energy consumption anomalies in an energy system and simulation/predictive modeling (or machine learning modeling), as described herein, may be performed using a wide variety of methods or combinations of methods, such as supervised learning, unsupervised learning, temporal difference learning, reinforcement learning and so forth. Some non-limiting examples of supervised learning which may be used with the present technology include AODE (averaged one-dependence estimators), artificial neural network, backpropagation, Bayesian statistics, naive bays classifier, Bayesian network, Bayesian knowledge base, case-based reasoning, decision trees, inductive logic programming, Gaussian process regression, gene expression programming, group method of data handling (GMDH), learning automata, learning vector quantization, minimum message length (decision trees, decision graphs, etc.), lazy learning, instance-based learning, nearest neighbor algorithm, analogical modeling, probably approximately correct (PAC) learning, ripple down rules, a knowledge acquisition methodology, symbolic machine learning algorithms, sub symbolic machine learning algorithms, support vector machines, random forests, ensembles of classifiers, bootstrap aggregating (bagging), boosting (meta-algorithm), ordinal classification, regression analysis, information fuzzy networks (IFN), statistical classification, linear classifiers, fisher's linear discriminant, logistic regression, perceptron, support vector machines, quadratic classifiers, k-nearest neighbor, hidden Markov models and boosting. Some non-limiting examples of unsupervised learning which may be used with the present technology include artificial neural network, data clustering, expectation-maximization, self-organizing map, radial basis function network, vector quantization, generative topographic map, information bottleneck method, IBSEAD (distributed autonomous entity systems based interaction), association rule learning, apriori algorithm, eclat algorithm, FP-growth algorithm, hierarchical clustering, single-linkage clustering, conceptual clustering, partitional clustering, k-means algorithm, fuzzy clustering, and reinforcement learning. Some non-limiting example of temporal difference learning may include Q-learning and learning automata. Specific details regarding any of the examples of supervised, unsupervised, temporal difference or other machine learning described in this paragraph are known and are within the scope of this disclosure. Also, when deploying one or more machine learning models, a computing device may be first tested in a controlled environment before being deployed in a public setting. Also, even when deployed in a public environment (e.g., external to the controlled, testing environment), the computing devices may be monitored for compliance.

In one aspect, the computing system 12/computing environment 402 may perform one or more calculations according to mathematical operations or functions that may involve one or more mathematical operations (e.g., solving differential equations or partial differential equations analytically or computationally, using addition, subtraction, division, multiplication, standard deviations, means, averages, percentages, statistical modeling using statistical distributions, by finding minimums, maximums or similar thresholds for combined variables, etc.).

Figure 5:
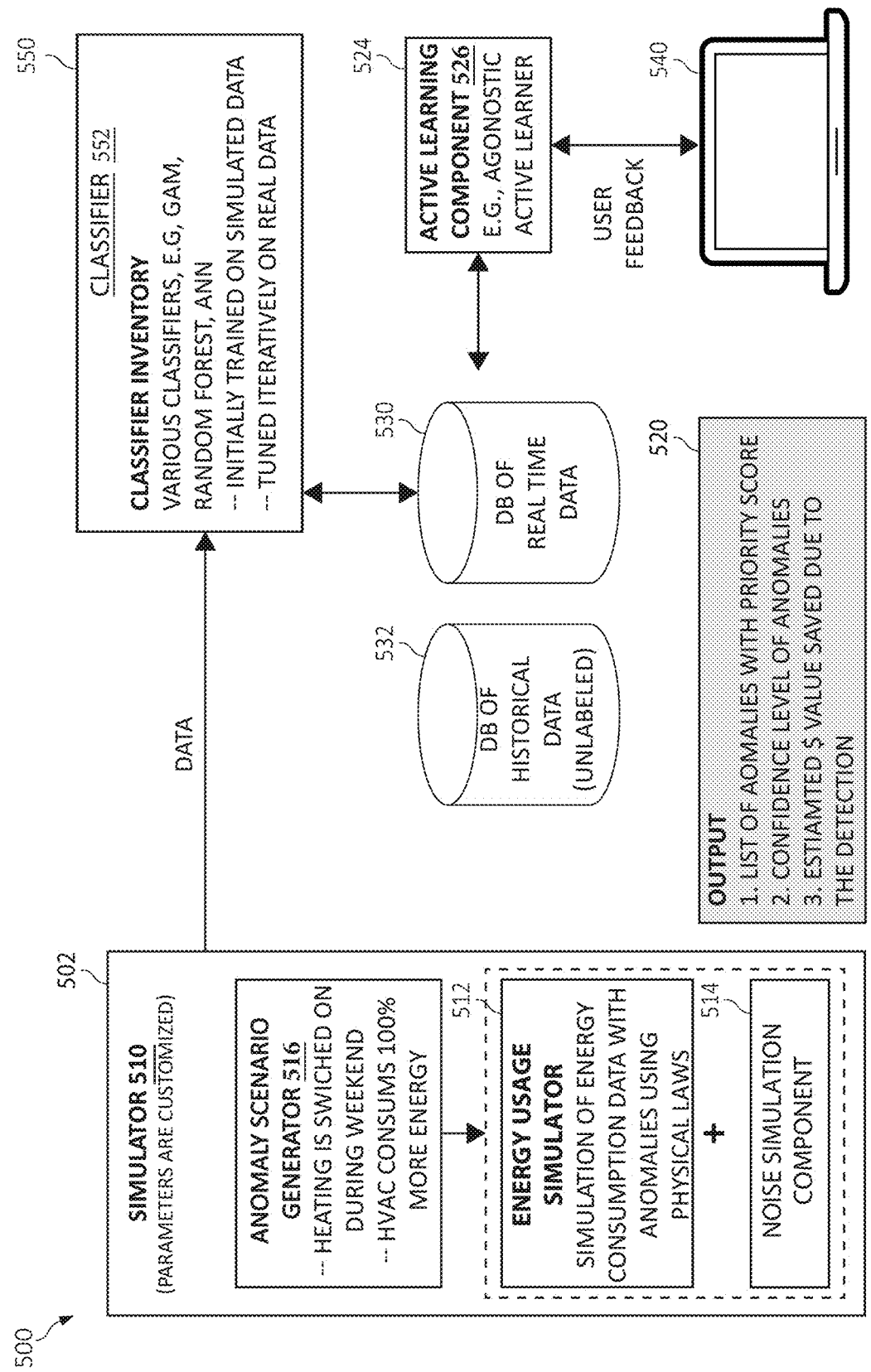
FIG. 5 is an additional diagram depicting various user hardware and computing components functioning in accordance with aspects of the present invention.

Turning now to FIG. 5, a block diagram of exemplary functionality 500 relating to intelligent detection and diagnosis of energy consumption anomalies in one or more energy consumption systems using an array of IoT sensors is depicted, for use in the overall context of intelligent energy consumption anomalies in one or more energy consumption systems to various aspects of the present invention. As shown, the various blocks of functionality are depicted with arrows designating the blocks' 500 relationships with each other and to show process flow. Additionally, descriptive information is also seen relating each of the functional blocks 500. As will be seen, many of the functional blocks may also be considered "modules" of functionality, in the same descriptive sense as has been previously described in FIG. 4.

With the foregoing in mind, the module blocks 500 may also be incorporated into various hardware and software components of a system for detection and diagnosis of energy consumption anomalies in one or more energy consumption systems in accordance with the present invention. Many of the functional blocks 500 may execute as background processes on various components, either in distributed computing components, or on the user device, or elsewhere, and generally unaware to the user performing generalized tasks The blocks of functionality 500 may also be incorporated into various hardware and software components of FIGS. 1-4. The functionality 500 may be implemented as a method executed as instructions on a machine, where the instructions are included on at least one computer readable medium or one non-transitory machine-readable storage medium.

Starting in block 502, a simulator 510 includes an anomaly scenario generator 516 (e.g., scenario data such as, for example, "heating is switched on during the weekend," or "HVAC consumes 100% more energy"). The simulator 510 may also include an energy usage simulator 512 based on or configured according to one or more physical laws such as, for example, simulation of energy consumption data with one or more anomalies using the physical laws (e.g., energy plus—energy plus may be an entire building simulation program which simulates building energy consumption and operational anomalies using physical laws). In addition, various noises may also be simulated (e.g., gaussian) via a noise simulation component 514. The simulated building energy consumption data may be obtained directly from simulation tools (e.g., Energy Plus data is often not realistic due to various real-life disturbances. Adding simulated noise to the simulated data enables more realistic scenarios/noises and may be a part of the simulation component). Simulated data may be rescaled by one or more parameters derived from real historical data of database 532 "DB" (e.g., mean and standard deviation).

At block 550, a classifier 552 may receive the simulated data from the simulator 510 and apply one or more classification operation on the simulated data (e.g., generalized additive models ("GAM"), regression, random forest, (deep) artificial neural network ("ANN"), boosting.

At block 524, an active learning component 526 may receive and use feedback from user 540 and modify the classification. Database 530 ("DB") may collect real-time sensor/meter data and database 532 may include historical data (e.g., historical sensor/meter data and/or historical simulated scenario data.

Using the simulated data from the simulator 510, the classification information from classifier 552, data from databases 530 and 530, active learning from the active learning component 526, the cognitive system may output a result, as in block 520. In one aspect, the output may include, for example, 1) a list of anomalies with priority score, 2) a confidence level of anomalies, and/or 3) an estimation of cost value saved due to the early detection of the anomaly.

Figure 6:
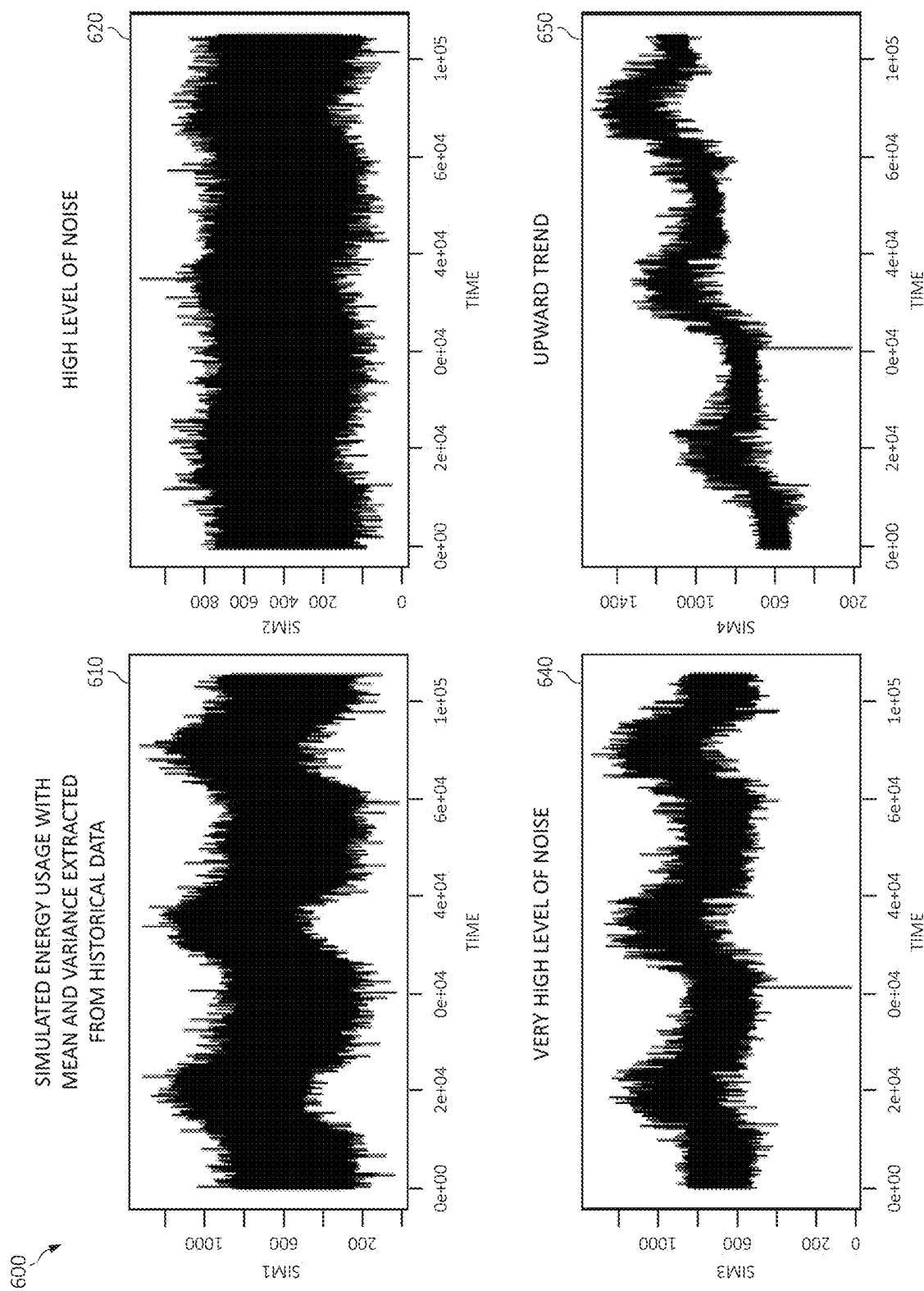
FIG. 6 is a diagram depicting various graphs detection of energy consumption anomalies in accordance with aspects of the present invention.

Turning now to FIG. 6, various graphs 610, 620, 640, and 650 are depicted in diagram 600 for detection of energy consumption anomalies. In each of the graphs 610, 620, 640, and 650, the time is depicted on the x-axis and the simulation is displayed on the y-axis. For example, graph 610 illustrates simulated energy usage with a mean and variance extracted from historical data. Graph 620 illustrates a high level of noise. Graph 640 depicts a very high level of noise, and Graph 650 illustrates upward trends.

Figure 7:
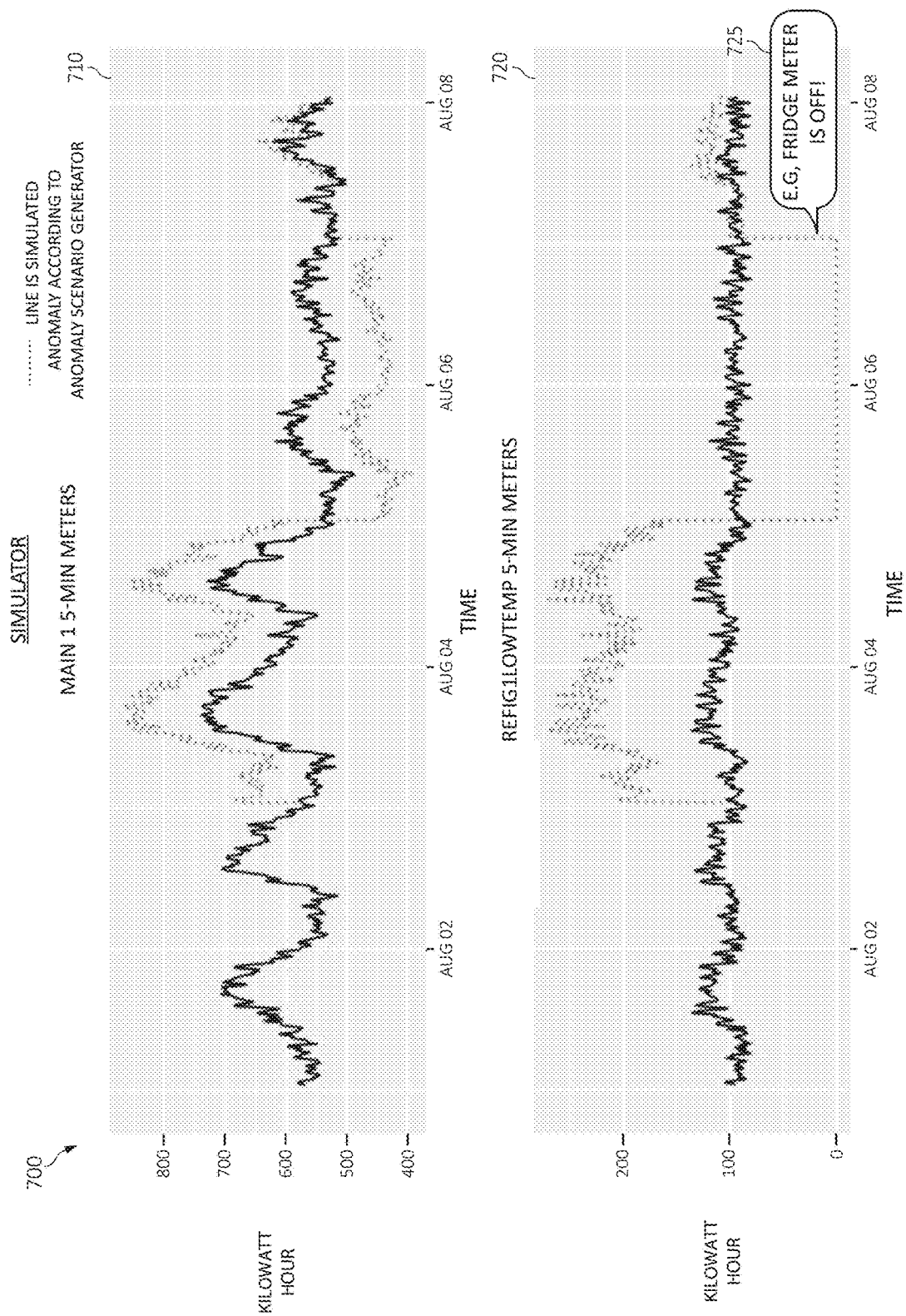
FIG. 7 is a diagram depicting various graphs detection of energy consumption anomalies in accordance with aspects of the present invention.

Turning now to FIG. 7, diagram 700 depicts graphs 710 and 720 for detection of energy consumption anomalies (e.g., measurements depicted as solid black lines). As illustrated in both graphs 710 and 720, a simulation line indicates a simulated anomaly according to an anomaly scenario generator. As illustrated in block 625, a fridge meter is offline or completely shut off for a selected period of time (e.g., from August $5^{th}$-August $7^{th}$) as the simulation line shows a zero value (the Y-axis shows a kilowatt hour such as, for example, 0, 100, 200 and 400, 500, 600, 700 and 800, etc., and time is displayed on the X-axis).

Figure 8:
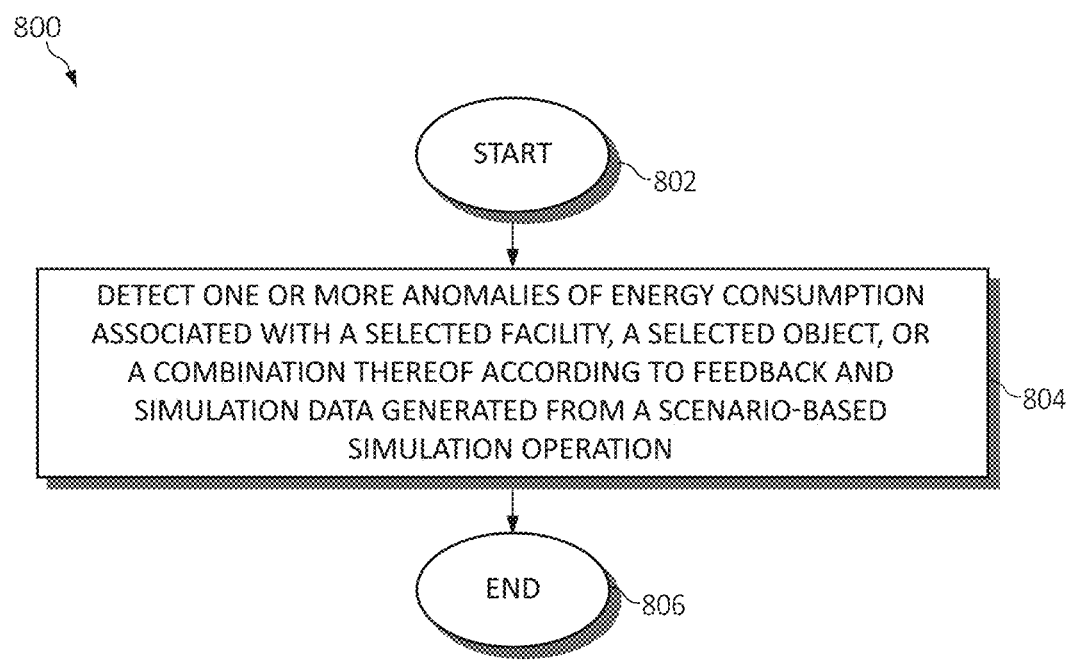
FIG. 8 is a flowchart diagram of an exemplary method for detection of energy consumption anomalies of one or more facilities in an Internet of Things (IoT) computing network in accordance with aspects of the present invention.

FIG. 8 is a method 800 for detection of energy consumption anomalies in one or more energy consumption systems in a cloud computing environment, in which various aspects of the illustrated embodiments may be implemented. The blocks of functionality 800 may also be incorporated into various hardware and software components of FIGS. 1-5. The functionality 800 may be implemented as a method executed as instructions on a machine, where the instructions are included on at least one computer readable medium or one non-transitory machine-readable storage medium. The functionality 800 may start in block 802.

One or more energy consumption anomalies associated with a selected facility, a selected object, or a combination thereof may be detected and diagnosed according to feedback (e.g., user feedback) and simulation data generated from a scenario-based simulation operation, as in block 804. The functionality 800 may end in block 806.

Figure 9:
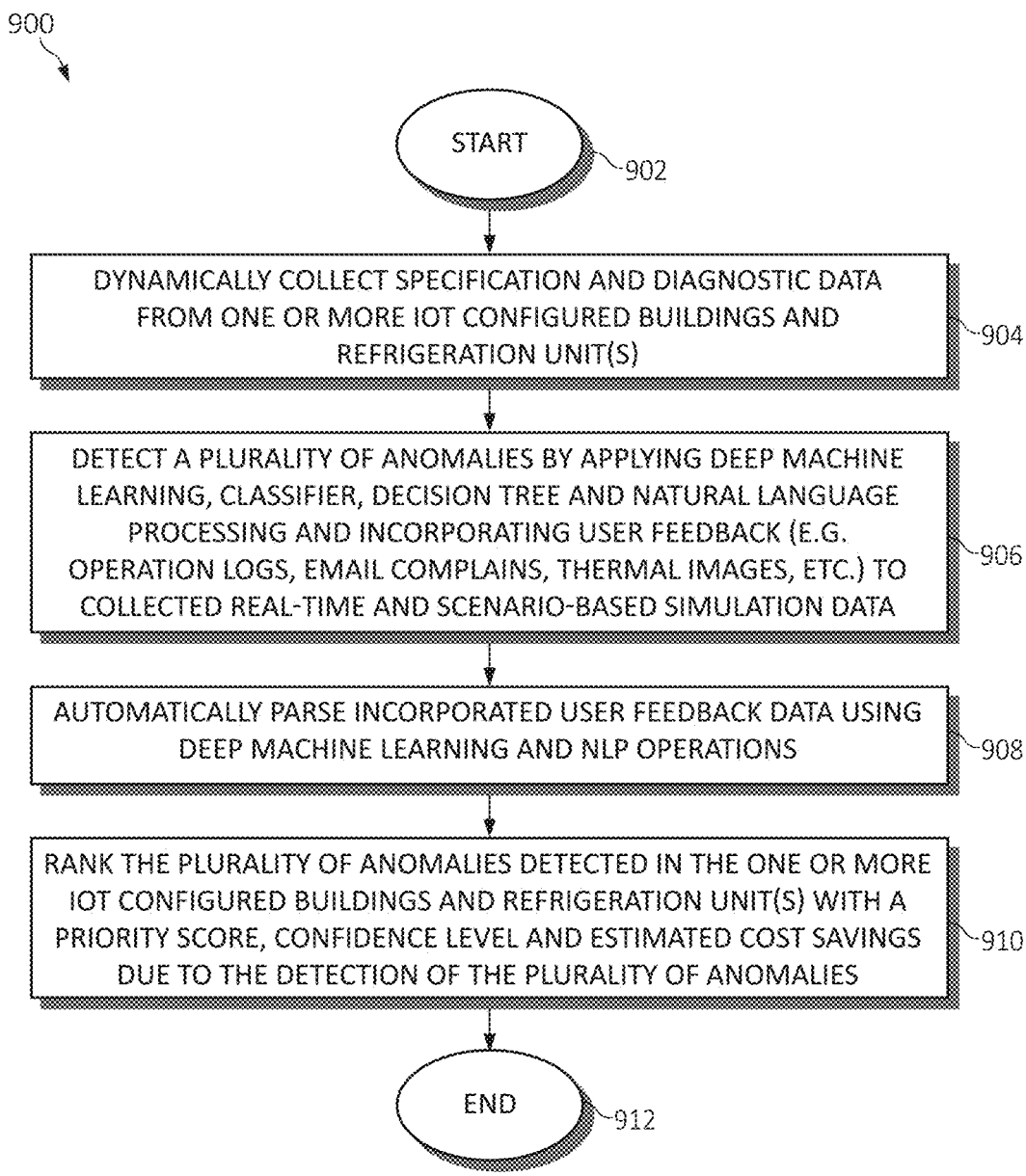
FIG. 9 is a flowchart diagram of an exemplary method for detection of energy consumption anomalies of one or more facilities in an Internet of Things (IoT) computing network in accordance with aspects of the present invention.

FIG. 9 is a method 900 for detection of energy consumption anomalies in one or more energy consumption systems in a cloud computing environment, in which various aspects of the illustrated embodiments may be implemented. The blocks of functionality 900 may also be incorporated into various hardware and software components of FIGS. 1-5. The functionality 900 may be implemented as a method executed as instructions on a machine, where the instructions are included on at least one computer readable medium or one non-transitory machine-readable storage medium. The functionality 900 may start in block 902.

Specification and diagnostic data may be dynamically collected from one or more IoT configured buildings and refrigeration units, as in block 904. A plurality of anomalies may be detected by applying deep machine learning, a classifier, a decision tree and NLP operation and incorporating feedback (e.g., operation logs, email complains, thermal images, etc.) to collected real-time and scenario-based simulation data, as in block 906. Incorporated feedback data may be automatically parsed using deep machine learning and an NLP operation(s), as in block 908. The plurality of anomalies detected in the one or more IoT configured buildings and refrigeration unit(s) may be ranked with a priority score, confidence level and estimated cost savings due to the detection of the plurality of anomalies, as in block 910. The functionality 900 may end in block 912.

In one aspect, in conjunction with and/or as part of at least one block of FIGS. 8-9, the operations of methods 800 and/or 900 may include each of the following. The operations of methods 800 and/or 900 may collect sensor data from one or more Internet of Things (IoT) devices, sensor devices, or a combination thereof associated with the selected facility, the selected object, or a combination thereof, train one or more machine learning models using uncontaminated data, and/or apply one or more machine learning models, a classifier, a decision tree, a natural language processing ("NLP") operation, or a combination thereof to one or more defined anomaly scenarios during the scenario-based simulation operation.

The operations of methods 800 and/or 900 may distinguish between a data anomaly and an operational anomaly associated with the selected facility, the selected object, or a combination thereof using an active learning operation, rank the one or more anomalies of energy consumption according to a priority score, an assigned confidence level, a predicted energy efficiency cost saving, or a combination thereof, and/or generate a list of anomalies according to an assigned rank.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method for anomaly detection of energy consumption in one or more energy consumption systems by one or more processors, comprising:
    initiating a scenario-based simulation operation using simulated energy consumption data from a historical data of a database;
    executing machine learning logic to receive simulated data from the scenario-based simulation operation and generate an energy classification model using the simulated data;
    detecting one or more anomalies of energy consumption associated with a selected facility, a selected object, or a combination thereof according to feedback and the simulation data generated from the scenario-based simulation operation and analyzed using the energy classification model; and
    outputting an indication, on a user interface, of the detected one or more anomalies.

2. The method of claim 1, further including collecting sensor data from one or more Internet of Things (IoT) devices, sensor devices, or a combination thereof associated with the selected facility, the selected object, or a combination thereof.

3. The method of claim 1, wherein executing the machine learning logic includes training the energy classification model using uncontaminated data.

4. The method of claim 1, further including applying the energy classification model, a classifier, a decision tree, a natural language processing ("NLP") operation, or a combination thereof to one or more defined anomaly scenarios during the scenario-based simulation operation.

5. The method of claim 1, further including distinguishing between a data anomaly and an operational anomaly associated with the selected facility, the selected object, or a combination thereof using an active learning operation.

6. The method of claim 1, further including ranking the one or more anomalies of energy consumption according to a priority score, an assigned confidence level, a predicted energy efficiency cost saving, or a combination thereof.

7. The method of claim 1, further including generating a list of anomalies according to an assigned rank.

8. A system for anomaly detection of energy consumption in one or more energy consumption systems, comprising:
    one or more computers with executable instructions that when executed cause the system to:
        initiate a scenario-based simulation operation using simulated energy consumption data from a historical data of a database;
        execute machine learning logic to receive simulated data from the scenario- based simulation operation and generate an energy classification model using the simulated data;
        detect one or more anomalies of energy consumption associated with a selected facility, a selected object, or a combination thereof according to feedback and the simulation data generated from the scenario-based simulation operation and analyzed using the energy classification model; and
        output an indication, on a user interface, of the detected one or more anomalies.

9. The system of claim 8, wherein the executable instructions further collect sensor data from one or more Internet of Things (IoT) devices, sensor devices, or a combination thereof associated with the selected facility, the selected object, or a combination thereof.

10. The system of claim 8, wherein executing the machine learning logic includes training the energy classification model using uncontaminated data.

11. The system of claim 8, wherein the executable instructions further apply the energy classification model, a classifier, a decision tree, a natural language processing ("NLP") operation, or a combination thereof to one or more defined anomaly scenarios during the scenario-based simulation operation.

12. The system of claim 8, wherein the executable instructions further distinguish between a data anomaly and an operational anomaly associated with the selected facility, the selected object, or a combination thereof using an active learning operation.

13. The system of claim 8, wherein the executable instructions further rank the one or more anomalies of energy consumption according to a priority score, an assigned confidence level, a predicted energy efficiency cost saving, or a combination thereof.

14. The system of claim 8, wherein the executable instructions further generate a list of anomalies according to an assigned rank.

15. A computer program product for anomaly detection of energy consumption in one or more energy consumption systems by a processor, the computer program product comprising a non-transitory computer-readable storage medium having computer-readable program code portions stored therein, the computer-readable program code portions comprising:
    an executable portion that initiates a scenario-based simulation operation using simulated energy consumption data from a historical data of a database;
    an executable portion that executes machine learning logic to receive simulated data from the scenario-based simulation operation and generate an energy classification model using the simulated data;
    an executable portion that detects one or more anomalies of energy consumption associated with a selected facility, a selected object, or a combination thereof according to feedback and the simulation data generated from the scenario-based simulation operation and analyzed using the energy classification model; and
    an executable portion that outputs an indication, on a user interface, of the detected one or more anomalies.

16. The computer program product of claim 15, further including an executable portion that collects sensor data from one or more Internet of Things (IoT) devices, sensor devices, or a combination thereof associated with the selected facility, the selected object, or a combination thereof.

17. The computer program product of claim 15, wherein executing the machine learning logic includes training the energy classification model using uncontaminated data.

18. The computer program product of claim 15, further including an executable portion that applies the energy classification model, a classifier, a decision tree, a natural language processing ("NLP") operation, or a combination thereof to one or more defined anomaly scenarios during the scenario-based simulation operation.

19. The computer program product of claim 15, further including an executable portion that distinguishes between a data anomaly and an operational anomaly associated with the selected facility, the selected object, or a combination thereof using an active learning operation.

20. The computer program product of claim 15, further including an executable portion that:
  ranks the one or more anomalies of energy consumption according to a priority score, an assigned confidence level, a predicted energy efficiency cost saving, or a combination thereof; and
  generates a list of anomalies according to the rank.

* * * * *